US010438914B2

(12) United States Patent
Unruh et al.

(10) Patent No.: US 10,438,914 B2
(45) Date of Patent: *Oct. 8, 2019

(54) SURFACE FINISHES FOR HIGH DENSITY INTERCONNECT ARCHITECTURES

(71) Applicant: Intel Corporation, Santa Clara, CA (US)

(72) Inventors: David Unruh, Chandler, AZ (US); Srinivas V. Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/039,595

(22) Filed: Jul. 19, 2018

(65) Prior Publication Data
US 2018/0323162 A1 Nov. 8, 2018

Related U.S. Application Data

(63) Continuation of application No. 15/088,711, filed on Apr. 1, 2016, now Pat. No. 10,049,996.

(51) Int. Cl.
H01L 23/00 (2006.01)
(52) U.S. Cl.
CPC .............. H01L 24/13 (2013.01); H01L 24/11 (2013.01); H01L 24/14 (2013.01);
(Continued)
(58) Field of Classification Search
CPC ......... H01L 24/11; H01L 24/13; H01L 24/14; H01L 2224/11464; H01L 2224/13083;
(Continued)

(56) References Cited

U.S. PATENT DOCUMENTS 5,903,058 A * 5/1999 Akram .................... H01L 24/11
257/737
10,049,996 B2 8/2018 Unruh et al.
(Continued)

FOREIGN PATENT DOCUMENTS

KR 1020120011768 A 2/2012
WO WO-2017172204 A2 10/2017
WO WO-2017172204 A3 10/2017

OTHER PUBLICATIONS

"U.S. Appl. No. 15/088,711, Advisory Action dated Sep. 22, 2017", 3 pgs.
(Continued)

Primary Examiner — Peniel M Gumedzoe
(74) Attorney, Agent, or Firm — Schwegman Lundberg & Woessner, P.A.

(57) ABSTRACT

An electroless nickel, electroless palladium, electroless tin stack and associated methods are shown. An example method to form a solder bump may include forming a layer of a second material over a first material at a base of a trench in a solder resist layer. The first material includes nickel and the second material includes palladium. The method further includes depositing a third material that includes tin on the second material using an electroless deposition process, and forming a solder bump out of the third material using a reflow and deflux process.

18 Claims, 6 Drawing Sheets

(52) U.S. Cl.
CPC .......... *H01L 2224/11464* (2013.01); *H01L 2224/13083* (2013.01); *H01L 2224/13111* (2013.01); *H01L 2224/13155* (2013.01); *H01L 2224/13164* (2013.01); *H01L 2224/1403* (2013.01)

(58) Field of Classification Search
CPC . H01L 2224/13111; H01L 2224/13155; H01L 2224/13164; H01L 2224/1403
See application file for complete search history.

(56) References Cited

U.S. PATENT DOCUMENTS

| | | |
|---|---|---|
| 2001/0040290 A1 | 11/2001 | Sakurai et al. |
| 2003/0022477 A1 | 1/2003 | Hsieh et al. |
| 2007/0141750 A1 | 6/2007 | Iwasaki et al. |
| 2007/0234563 A1* | 10/2007 | Sakaguchi ........... B23K 3/0623 29/843 |
| 2008/0079461 A1 | 4/2008 | Lin et al. |
| 2008/0131996 A1 | 6/2008 | Wu |
| 2008/0143379 A1 | 6/2008 | Norman |
| 2010/0135611 A1 | 6/2010 | Asai et al. |
| 2011/0189848 A1 | 8/2011 | Ewert et al. |
| 2011/0248398 A1 | 10/2011 | Parvarandeh et al. |
| 2012/0098123 A1 | 4/2012 | Yu et al. |
| 2012/0248614 A1 | 10/2012 | Gandhi et al. |
| 2013/0087920 A1 | 4/2013 | Jeng et al. |
| 2013/0113094 A1 | 5/2013 | Wu et al. |
| 2014/0097007 A1 | 4/2014 | Nagai et al. |
| 2014/0117552 A1* | 5/2014 | Qian ................ H01L 23/49827 257/762 |
| 2014/0273355 A1 | 9/2014 | Wu |
| 2015/0008576 A1 | 1/2015 | Khandekar et al. |
| 2015/0008586 A1 | 1/2015 | Tsai et al. |
| 2015/0303157 A1 | 10/2015 | Uzoh et al. |
| 2016/0056102 A1* | 2/2016 | Konchady ........... H01L 23/5389 174/263 |
| 2017/0287860 A1 | 10/2017 | Unruh et al. |

OTHER PUBLICATIONS

"U.S. Appl. No. 15/088,711, Examiner Interview Summary dated Mar. 22, 2018", 3 pgs.
"U.S. Appl. No. 15/088,711, Final Office Action dated Jul. 14, 2017", 17 pgs.
"U.S. Appl. No. 15/088,711, Non Final Office Action dated Feb. 9, 2017", 19 pgs.
"U.S. Appl. No. 15/088,711, Non Final Office Action dated Dec. 29, 2017", 14 pgs.
"U.S. Appl. No. 15/088,711, Notice of Allowance dated Apr. 12, 2018", 7 pgs.
"U.S. Appl. No. 15/088,711, Response filed Mar. 13, 2018 to Non Final Office Action dated Dec. 29, 2017", 6 pgs.
"U.S. Appl. No. 15/088,711, Response filed May 9, 2017 to Non Final Office Action dated Feb. 9, 2017", 14 pgs.
"U.S. Appl. No. 15/088,711, Response filed Sep. 14, 2017 to Final Office Action dated Jul. 14, 2017", 15 pgs.
"U.S. Appl. No. 15/088,711, Response filed Dec. 5, 2016 to Restriction Requirement dated Oct. 3, 2016", 7 pgs.
"U.S. Appl. No. 15/088,711, Restriction Requirement dated Oct. 3, 2016", 7 pgs.
"International Application Serial No. PCT/US2017/020163, International Search Report dated Jun. 19, 2017", 4 pgs.
"International Application Serial No. PCT/US2017/020163, Written Opinion dated Jun. 19, 2017", 10 pgs.
"International Application Serial No. PCT/US2017/020163, International Preliminary Report on Patentability dated Oct. 11, 2018", 12 pgs.

* cited by examiner

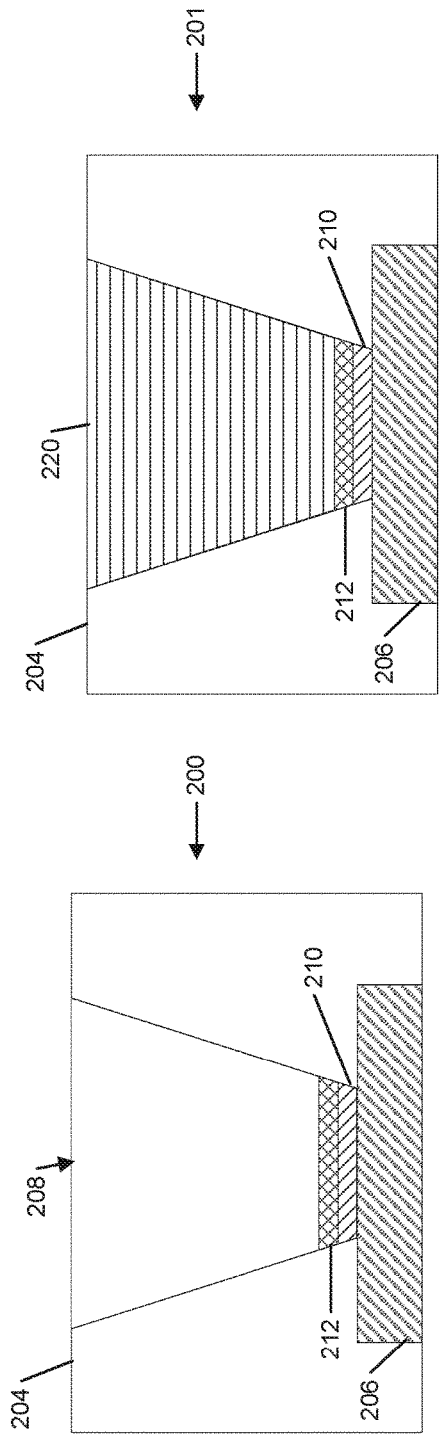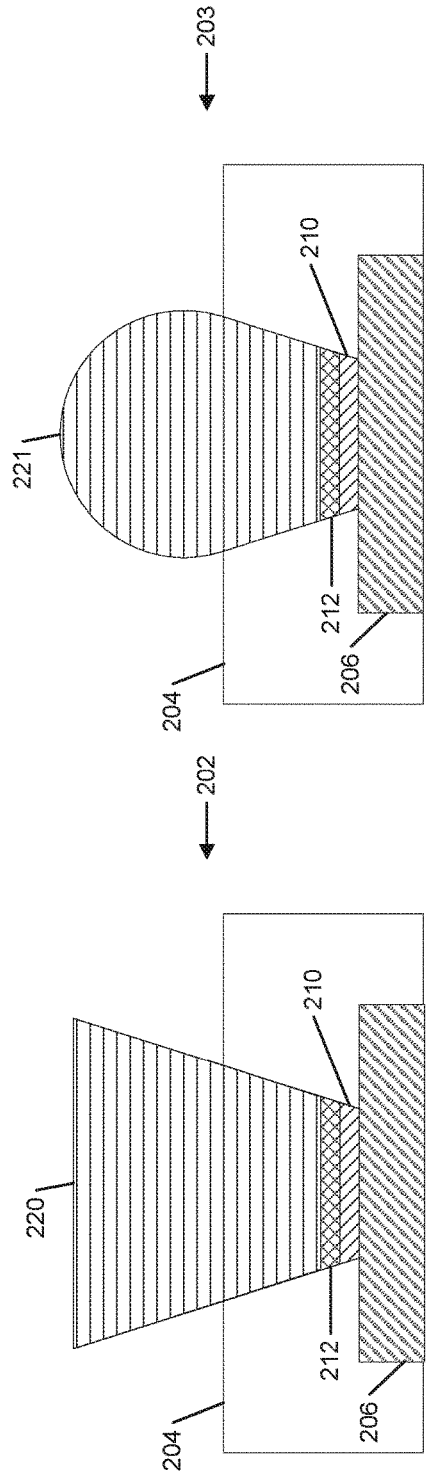

600

610 — FORM A FIRST ELECTROLESS NICKEL, ELECTROLESS PALLADIUM, ELECTROLESS TIN (ENEPET) STACK IN A SOLDER RESIST LAYER OF A PACKAGE.

620 — CONTEMPORANEOUSLY WITH FORMATION THE FIRST ENEPET STACK IN THE SOLDER RESIST LAYER OF THE PACKAGE, FORMING A SECOND ENEPET STACK IN THE SOLDER RESIST LAYER OF THE PACKAGE.

FIG. 6

SURFACE FINISHES FOR HIGH DENSITY INTERCONNECT ARCHITECTURES

CROSS-REFERENCE TO RELATED APPLICATION

This application is a continuation of U.S. patent application Ser. No. 15/088,711, filed Apr. 1, 2016, which is incorporated by reference herein in its entirety.

BACKGROUND

Traditional stencil-based technologies for fine electrolytic pitch bumping (e.g, Micro-ball bumping or Solder Paste Printing) are reaching scaling limits as pitches become finer in semiconductor packaging For high bandwidth connectivity packaging bumping is needed for varying pitch and solder resist opening (SRO) layer sizes, and the traditional stencil methods do not work for these types of technologies. Further, electrolytic plating can be used to overcome some of the deficiencies of stencil-based technologies, but is much more costly (e.g, use of gold and many complex process steps) and has several limitations, including dry film resist (DFR) compatibility with bump plating bath, stripping of the DFR and seed layer without damaging the bump and the DFR adhesion to the seed layer at finer pitches. Traditional technologies may use gold during the process of forming a conductive bump. Thus, improved methods and devices are desirable to address issues including but not limited to, reduction in manufacture costs and variable solder bump pitch.

BRIEF DESCRIPTION OF THE DRAWINGS

FIGS. 2A-2D are a cross section of formation of a solder bump in accordance with some embodiments of the disclosure.

FIG. 6 is a flow diagram of an example method of forming multiple solder bumps in accordance with some embodiments of the disclosure.

DESCRIPTION OF EMBODIMENTS

Figure 1A:
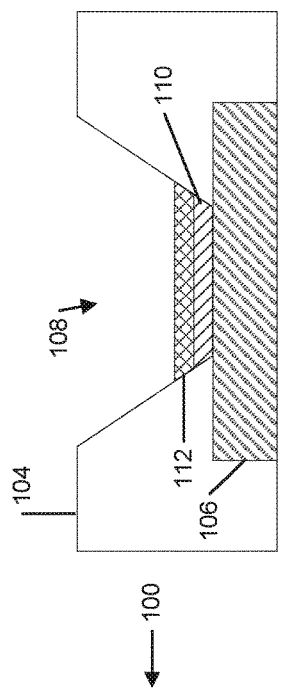
FIGS. 1A-D are a cross section of formation of a solder bump in accordance with some embodiments of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Although the present disclosure uses elements of semiconductor chip packages, and their method of manufacture as an example, the disclosure is not so limited. Examples of the present disclosure may be used in any technology where formation of a solder bump in a solder resist layer is controlled.

FIGS. 1A-1D show a cross-section schematic view of formation of a solder bump 121 using an electroless nickel or nickel alloy/palladium/tin or tin alloy (ENEPET) stack in accordance with embodiments of the disclosure. The package 100, package 101, package 102, and package 103 of FIGS. 1A-1D, respectively, may include some of the same materials/layers/components. Those materials/layers/components that are common among all or a subset of the package 100, package 101, package 102, and package 103 of FIGS. 1A-1D use common reference numbers. In the interests of brevity and clarity, description of the formation of these common layers/materials/components will not be repeated for each figure.

Turning now to FIG. 1A, the package 101 may include a SR layer 104 having an electrode 106 and a trench 108 that extends vertically to the electrode 106. The SR layer 104 may include a solder resist (SR) material, such as an epoxy or plastic-organic material. The electrode 106 may include copper, a copper alloy, or another conductive material. The trench 108 may be formed by etching a trench in the SR layer 104. In some examples, the sidewalls of the trench 108 may be angled outward from a horizontal center of the trench 108. In other examples, the sidewalls of the trench 108 may be perpendicular to a top surface of the SR layer 104. The process of forming the solder bump 121 depicted in FIG. 1D may include forming a layer of a first material 110 at the base of the trench 108. The first material 110 may contact the electrode 106 at the base of the trench 108 and the sidewalls of the SR layer 104 within the trench 108. The first material 110 may include nickel or a nickel alloy such as nickel-phosphorous (Ni—P). Other materials may be used that exhibit conductivity and diffusion barrier properties similar to nickel or nickel alloys, such as cobalt-phosphorous or iron-phosphorous. The deposition of the first material 110 may be via an electroless deposition process (e.g, an auto-catalytic reaction without use of an electrical field).

Figure 1B:
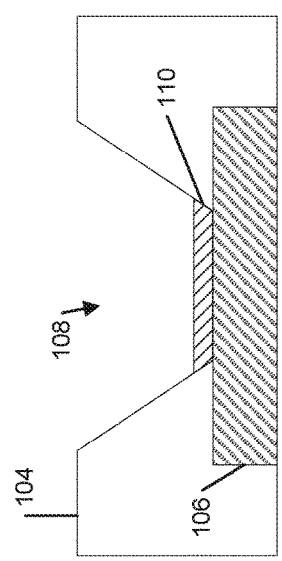
Figure 1C:
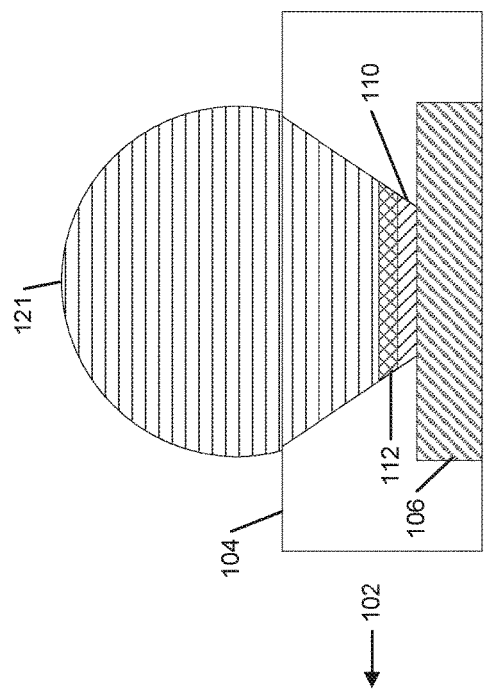
Figure 1D:
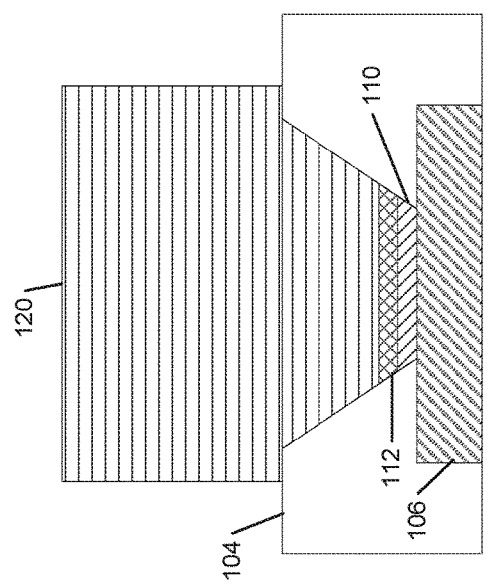

As depicted in the package 101 of FIG. 1B, the process of forming the solder bump 121 depicted in FIG. 1D may further include forming a layer of a second material 112 over the first material 110 at the base of the trench 108. The second material 112 may contact the first material 110 at the base of the trench 108 and the sidewalls of the SR layer 104 within the trench 108. The second material 112 may include palladium (Pd). The deposition of the second material 112 may be via an electroless deposition process.

As depicted in the package 102 of FIG. 1C, the process of forming the solder bump 121 depicted in FIG. 1D may further include depositing a third material 120 over the second material 112 in the trench 108. The third material 120 may fill the trench 108 and extend above a top surface of the SR layer 104. While FIG. 1C depicts the shape of the third material 120 above the SR layer 104 as being rectangular, one with skill of the art would appreciate that the shape could be other than rectanglar, such as trapezoidal with a greater width at the surface of the SR layer 104 than at a top portion. The third material 120 may contact the second material 112 at the base of the trench 108 and the sidewalls of the SR layer 104 within the trench 108. The third material 120 may include tin (Sn) or a tin alloy (e.g, Sn—Cu, Sn—Ag Sn—Bi, etc.). The deposition of the third material 120 be via an electroless deposition process that efficiently deposits the third material 120 onto the second material 112.

As depicted in the package 103 of FIG. 1D, the process of forming the solder bump 121 may further include performing a solder reflow and deflux process on the third material 120 of FIG. 1C. The solder reflow and deflux process may adhere the solder bump 121 to the second material 112, the second material 112 to the first material 110 and the first material 110 to the electrode 106. The solder reflow and deflux process may also provide the solder bump 121 having a rounded shape above the surface of the SR layer 104 for connecting to the die. The rounded surface may have a circular or elliptical shape. The rounded shape may reduce the likelihood of shorting adjacent contacts together.

The solder bump 121 could then be used with a soldering process to form a solder joint with a die or other electrical component. In some examples, the solder bump 121 could form an oxide layer. In such cases, the soldering process may include an oxide removal and preferential surface wetting. By using the ENEPET stack to form the solder bump 121, cost and time may be reduced as compared with traditional stencil and electrolytic technologies. In addition, the ENEPET may be used to generate solder bump 121 on a single SR layer 104 that have different pitches. In some examples, the solder bump 121 pitches may be less than 25 μm, such as 20 μm.

FIGS. 2A-2D show a cross-section schematic view of formation of a solder bump 221 using an ENEPET stack in accordance with embodiments of the disclosure. The formation process depicted in FIGS. 2A-2D differs from the formation process depicted in FIGS. 1A-1D based on when the sidewalls of the SR layer 204 are etched down (e.g, after deposition of the third material 220) versus when the sidewalls of the SR layer 104 are etched down (e.g, prior to deposition of the first material 110). The package 200, package 201, package 202, and package 203 of FIGS. 2A-2D, respectively, may include some of the same materials/layers/components. Those materials/layers/components that are common among all or a subset of the package 200, package 201, package 202, and package 203 of FIGS. 2A-2D use common reference numbers. In the interests of brevity and clarity, description of the formation of these common layers/materials/components will not be repeated for each figure.

Turning now to FIG. 2A, the package 201 may include a SR layer 204 having an electrode 206 and a trench 208 that extends vertically to the electrode 206. The SR layer 204 may include a SR material, such as an epoxy or plastic-organic material. The electrode 206 may include copper, or another conductive material. The trench 208 may be formed by etching a trench in the SR layer 204. In some examples, the sidewalls of the trench 208 may be angled outward from a horizontal center of the trench 208. In other examples, the sidewalls of the trench 208 may be perpendicular to a top surface of the SR layer 204. The process of forming the solder bump 221 depicted in FIG. 2D may include forming a layer of a first material 210 at the base of the trench 208, and then forming a layer of a second material 212 over the first material 210. The first material 210 may contact the electrode 206 at the base of the trench 208 and the sidewalls of the SR layer 204 within the trench 208, and the second material 212 may contact the first material 210 at the base of the trench 208 and the sidewalls of the SR layer 204 within the trench 208. The first material 210 may include nickel or a nickel alloy, such as nickel-phosphorous (Ni—P) and the second material 212 may include palladium. For the first material 210, other materials may be used that exhibit conductivity and diffusion barrier properties similar to nickel or nickel alloy s, such as cobalt-phosphorous or iron-phosphorous. The deposition of the first material 210 and the second material 212 may each be via an electroless deposition process (e.g, an auto-catalytic reaction without use of an electrical field).

As depicted in the package 201 of FIG. 2B, the process of forming the solder bump 221 depicted in FIG. 2D may further include depositing a third material 220 over the second material 212 in the trench 208. The third material 220 may extend up to atop surface of the SR layer 204. The third material 220 may contact the second material 212 at the base of the trench 208 and the sidewalls of the SR layer 204 within the trench 208. The third material 220 may include tin (Sn) or an alloy of tin (e.g, Sn—Cu, Sn—Ag Sn—Bi, etc.). The deposition of the third material 220 be via an electroless deposition process that efficiently deposits the third material 220 onto the second material 212.

As depicted in the package 202 of FIG. 2C, the process of forming the solder bump 221 depicted in FIG. 2D may further include etching the SR layer 204 to remove a top portion of the SR layer 204. The third material 220 may remain in place such that a portion of the third material 220 is extends above the SR layer 204. The sides of the third material 220 may extend in an outward direction such that a width of the third material 220 at a top end is greater than a width of the third material 220 at a portion adjacent to the etched surface of the SR layer 204.

As depicted in the package 203 of FIG. 2D, the process of forming the solder bump 221 may further include performing a solder reflow and deflux process on the third material 220 of FIGS. 2B and 2C. The solder reflow and deflux process may adhere the solder bump 221 to the second material 212, the second material 212 to the first material 210 and the first material 210 to the electrode 206. The solder reflow and deflux process may also provide the solder bump 221 having a rounded shape above the surface of the SR layer 204 for connecting to another die. In some examples, the solder bump 221 may have a circular or elliptical shape. The rounded shape may reduce the likelihood of shorting adjacent contacts together.

The solder bump 221 could then be used with a soldering process to form a solder joint with a die or other electrical component. In some examples, the solder bump 221 could form an oxide layer. In such cases, the soldering process may include an oxide removal and preferential surface wetting. By using the ENEPET stack to form the solder bump 221, cost and time may be reduced as compared with traditional stencil and electrolytic technologies. In addition, the ENEPET may be used to generate solder bump 221 on a single SR layer 204 that have different pitches. In some examples, the solder bump 221 pitches may be less than 25 μm, such as 20 μm.

FIGS. 3A-3D show a cross-section schematic view of formation of a solder bump 321 using an ENEPET stack in accordance with embodiments of the disclosure. The formation process depicted in FIGS. 3A-3D differs from the formation process depicted in FIGS. 1A-1D by including deposition of the first material 310 and the second material 312 on the sidewalls of the trench 308, in addition to deposition on at the base of the trench 308. The package 300, package 301, package 302, and package 303 of FIGS. 3A-3D, respectively, may include some of the same materials/layers/components. Those materials/layers/components that are common among all or a subset of the package 300, package 301, package 302, and package 303 of FIGS. 3A-3D use common reference numbers. In the interests of brevity and clarity, description of the formation of these common layers/materials/components will not be repeated for each figure.

Figure 3A:
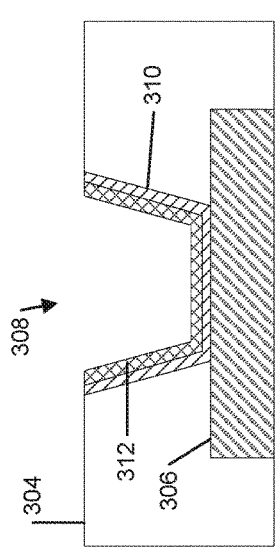
FIGS. 3A-3D are a cross section of formation of a solder bump in accordance with some embodiments of the disclosure.

Turning now to FIG. 3A, the package 301 may include a SR layer 304 having an electrode 306 and a trench 308 that extends vertically to the electrode 306. The SR layer 304 may include a SR material, such as an epoxy or plastic-organic material. The electrode 306 may include copper, or another conductive material. The trench 308 may be formed by etching a trench in the SR layer 304. In some examples, the sidewalls of the trench 308 may be angled outward from a horizontal center of the trench 308. In other examples, the sidewalls of the trench 308 may be perpendicular to a top surface of the SR layer 304. The process of forming the solder bump 321 depicted in FIG. 3D may include forming a layer of a first material 310 along the base and the sidewalls of the trench 308. The first material 310 may extend up the entire sidewall of the trench 308 to a top surface of the SR layer 304. The first material 310 may contact the electrode 306 at the base of the trench 308 and the sidewalls of the SR layer 304 within the trench 308. The first material 310 may include nickel or a nickel alloy, such as nickel-phosphorous (Ni—P). Other materials may be used that exhibit conductivity and diffusion barrier properties similar to nickel or nickel alloys, such as cobalt-phosphorous or iron-phosphorous. The deposition of the first material 310 be via an electroless deposition process.

Figure 3B:
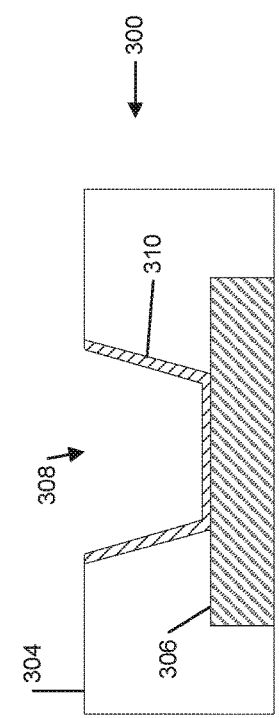
Figure 3C:
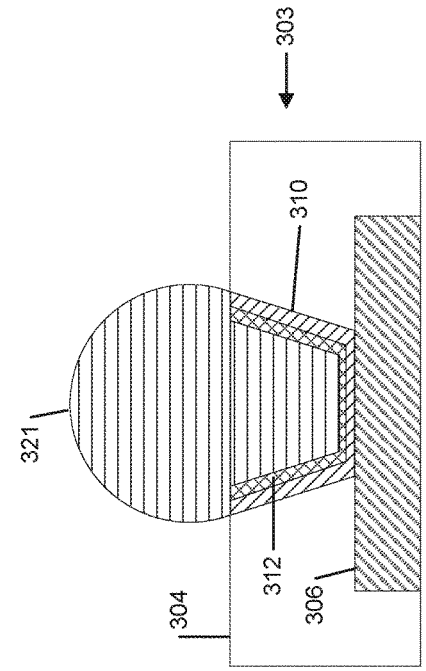
Figure 3D:
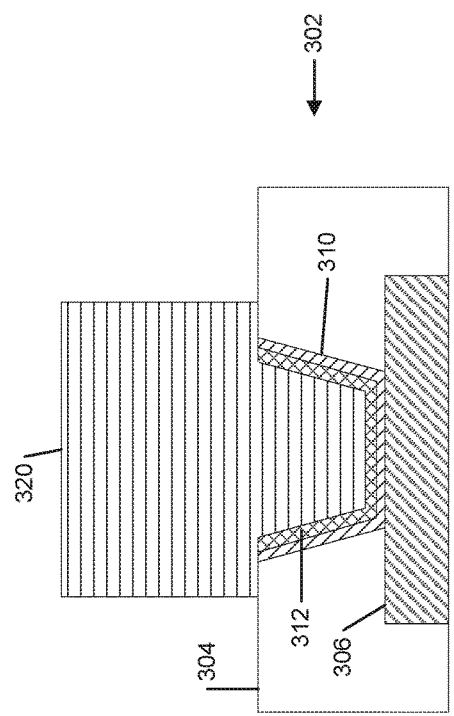

As depicted in the package 301 of FIG. 3B, the process of forming the solder bump 321 depicted in FIG. 3D may further include forming a layer of a second material 312 over the first material 310 along the base and sidewalls of the trench 308. The second material 312 may contact the first material 310 along the base and sidewalls of the trench 308. The second material 312 may include palladium (Pd). In some examples, the second material 312 may not include nickel (Ni). The deposition of the second material 312 be via an electroless deposition process.

As depicted in the package 302 of FIG. 3C, the process of forming the solder bump 321 depicted in FIG. 3D may further include depositing a third material 320 over the second material 312 in the base of the trench 308. The third material 320 may extend above a top surface of the SR layer 304. While FIG. 3C depicts the shape of the third material 320 above the SR layer 304 as being rectangular, one skilled in the art would appreciate that the shape could be other than rectanglar, such as trapezoidal with a greater width at the surface of the SR layer 304 than at a top portion. The third material 320 may contact the second material 312 along the base and sidewalls of the trench 308. The third material 320 may include tin (Sn) or an alloy of tin (e.g, Sn—Cu, Sn—Ag Sn—Bi, etc.). The deposition of the third material 320 be via an electroless deposition process that efficiently deposits the third material 320 onto the second material 312.

As depicted in the package 303 of FIG. 3D, the process of forming the solder bump 321 may further include performing a solder reflow and deflux process on the third material 320 of FIG. 3C. The solder reflow and deflux process may adhere the solder bump 321 to the second material 312, the second material 312 to the first material 310 and the first material 310 to the electrode 306. The solder reflow and deflux process may also provide the solder bump 321 having a rounded shape above the surface of the SR layer 304 for connecting to the die. The rounded shape may reduce the likelihood of shorting adjacent contacts together. The solder bump 321 may have a circular or elliptical shape.

The solder bump 321 could then be used with a soldering process to form a solder joint with a die or other electrical component. In some examples, the solder bump 321 could form an oxide layer. In such cases, the soldering process may include an oxide removal and preferential surface wetting. By using the ENEPET stack to form the solder bump 321, cost and time may be reduced as compared with traditional stencil and electrolytic technologies. In addition, the ENEPET may be used to generate solder bump 321 on a single SR layer 304 that have different pitches. In some examples, the solder bump 321 pitches may be less than 25 μm, such as 20 μm.

Figure 4:
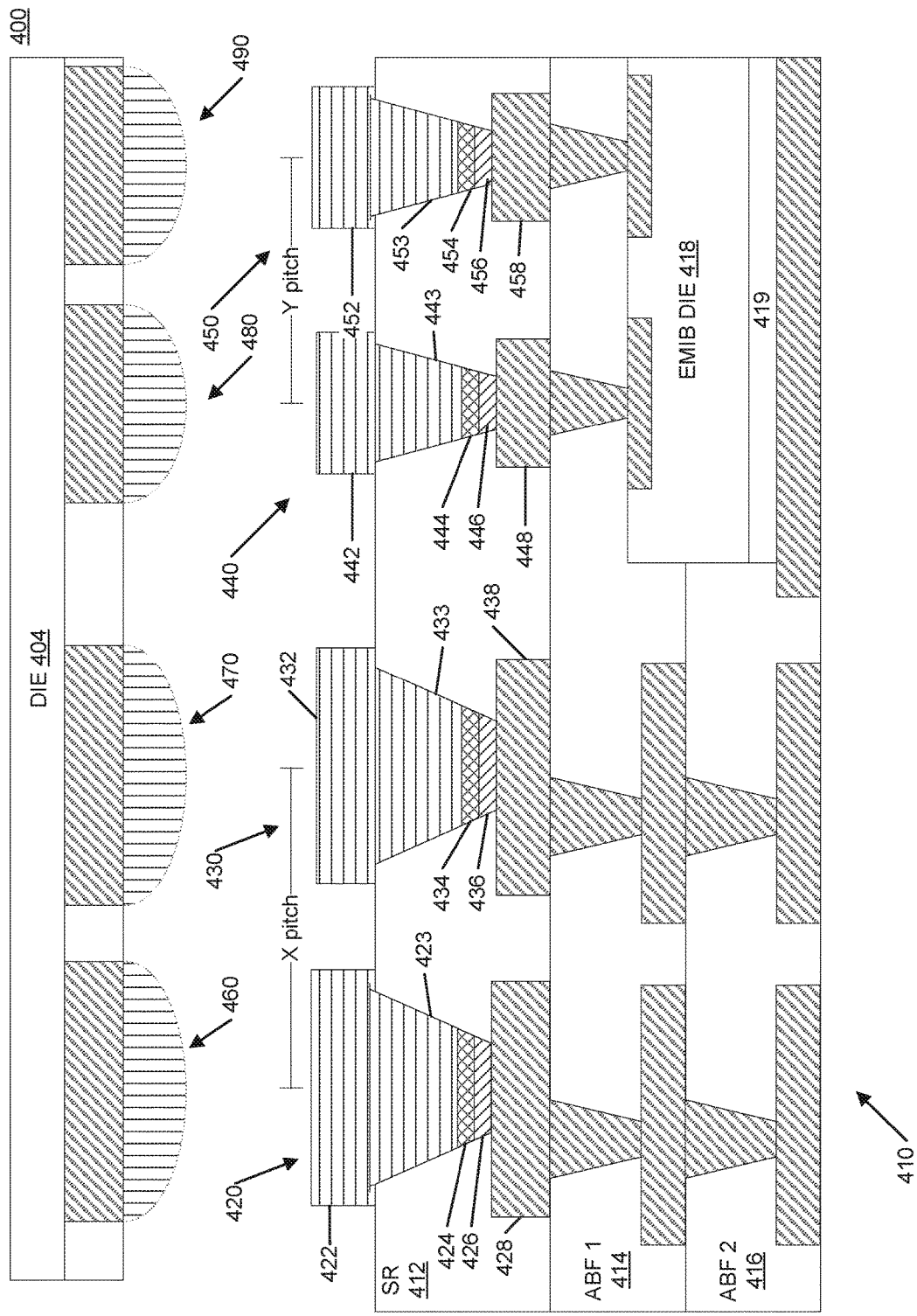
FIG. 4 is a cross section of a semiconductor package having varying pitch solder bumps in accordance with some embodiments of the disclosure.

FIG. 4 shows a cross-section schematic view of an apparatus 400 that includes a package 410 having a first ENEPET stack 420, a second ENEPET stack 430, a third ENEPET stack 440, and a fourth ENEPET stack 450 in accordance with embodiments of the disclosure. The die 410 may include three primary layers: a SR layer 412, a first Ajinimoto build-up film (ABF) film 414, and a second ABF film 416.

The first ENEPET stack 420, second ENEPET stack 430, third ENEPET stack 440, and fourth ENEPET stack 450 may each be formed in the SR layer 412. The first ENEPET stack 420 may include a tin or a suitable alloy of "Sn" material 422, a palladium layer 424, and a nickel or nickel alloy layer 426. The second ENEPET stack 430 may include a tin or a suitable alloy of "Sn" material 432, a palladium layer 434, and a nickel or nickel alloy layer 436. The third ENEPET stack 440 may include a tin or a suitable alloy of "Sn" material 442, a palladium layer 444, and a nickel or nickel alloy layer 446. The fourth ENEPET stack 450 may include a tin or a suitable alloy of "Sn" material 452, a palladium layer 454, and a nickel or nickel alloy layer 456. Each of the first ENEPET stack 420, the second ENEPET stack 430, the third ENEPET stack 440, and the fourth ENEPET stack 450 may be formed using one of the methods described in FIGS. 1-3(A-D). Although the first ENEPET stack 420, second ENEPET stack 430, the third ENEPET stack 440, and the fourth ENEPET stack 450 are each depicted with the layers 424, 426, 434, 436, 444, 446, 454, and 456 extending only along the base of the respective trench 433, 443, and 443, as previously described with reference to FIGS. 3A-D, the layers 424, 426, 434, 436, 444, 446, 454, and 456 may also extend up sidewalls of the respective trench 423, 433, 443, and 453. The pitch between the first ENEPET stack 420 and the second ENEPET stack 430 may have a different X pitch than the Y pitch between the third ENEPET stack 440 and the fourth ENEPET stack 450. In some examples, the X pitch and/or the Y pitch may be 20-25 μm. In some examples, the X pitch may be greater than 100 μm and the Y pitch may be less than 25 μm. The first ENEPET stack 420, second ENEPET stack 430, the third ENEPET stack 440, and the fourth ENEPET stack 450 may connect to an aligned contact 460, contact 470, contact 480, and contact 490 of the die 404.

The first ENEPET stack 420 may connect to an electrode 428 that extends down through the ABF films 414 and 416. The second ENEPET stack 430 may connect to an electrode 438 that extends down through the ABF films 414 and 416. The third ENEPET stack 440 and the fourth ENEPET stack 450 may connect to an electrode 448 and an electrode 458, respectively, that each extend down through the ABF film 414 to an embedded multi-die interconnect bridge (EMIB) 418. The electrodes 428, 438, 448, and 458 may each include a conductive material, such as copper or a copper alloy. The EMIB 418 may provide a high bandwidth connection between the die 404 and another die (not shown). The EMIB 418 may be held in place by a die-bond film (DBF) 419. By forming the first ENEPET stack 420, the second ENEPET stack 430, the third ENEPET stack 440, and the fourth ENEPET stack 450 with an electroless deposition process using one of the methods described in FIGS. 1-3(A-D), variable pitch can be achieved in the same package which may not be possible using traditional stencil technologies. Much finer pitches are possible compared to stencil-based technologies While the tin/tin alloy material 422, 432, 442, and 452 depicted in FIG. 4 has a rectangular shape above the SR layer 412, it would be appreciated that the tin/tin alloy material 422, 432, 442, and 452 may each have a rounded circular or elliptical shape above the SR layer 412 after a reflow and deflux process.

Figure 5:
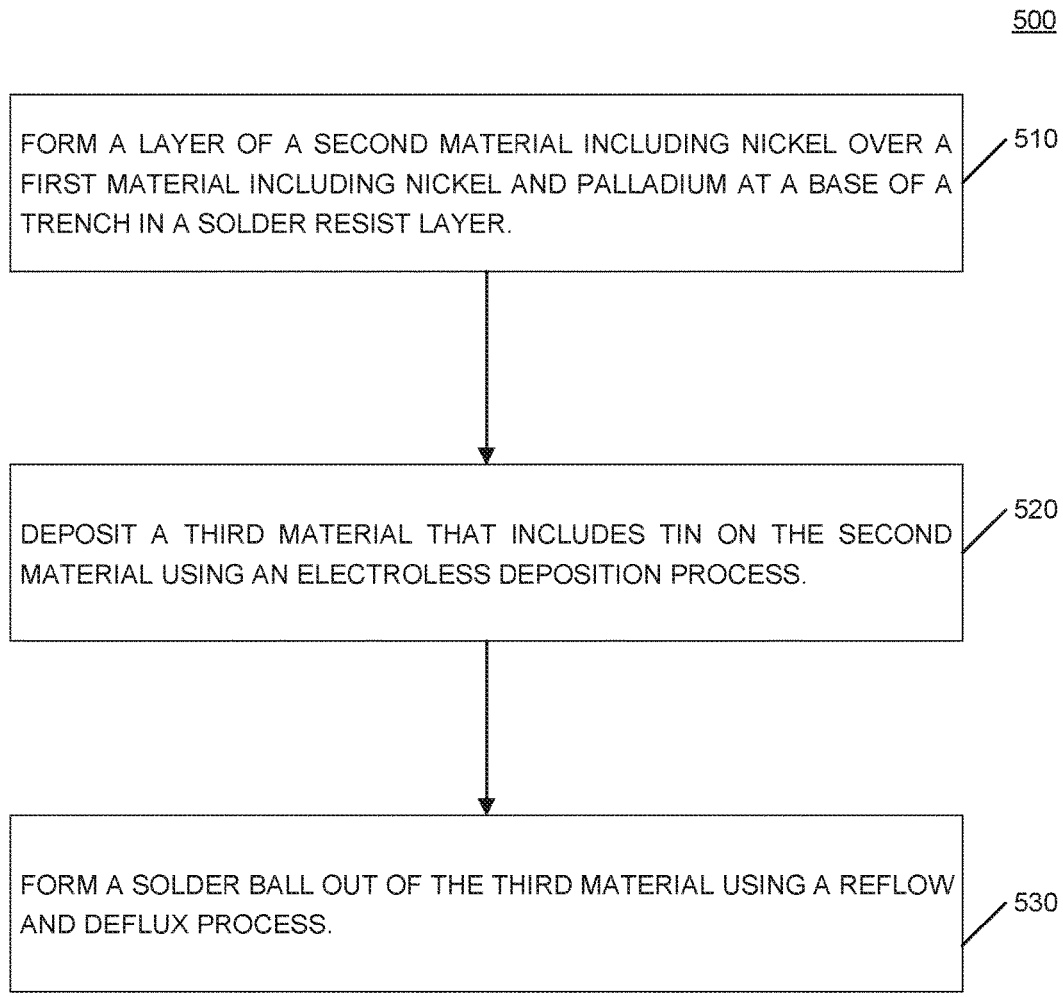
FIG. 5 is a flow diagram of an example method of forming a solder bump in accordance with some embodiments of the disclosure.

FIG. 5 illustrates a method 500 for forming a solder bump in accordance with some embodiments. The method 500 may be implemented for the packages 100-103 of FIGS. 1A-1D, respectively, the packages 200-203 of FIGS. 2A-2D, respectively, the packages 300-303 of FIGS. 3A-3D, respectively, respectively, the apparatus 400 of FIG. 4, or combinations thereof.

In some embodiments, the method 500 may include forming an electrode in the solder resist layer. In some embodiments, the method 500 may further include forming the trench in a solder resist layer of a package.

The method 500 may include forming a layer of a second material over a first material at a base of a trench in the solder resist layer, at 510. The first material may include nickel or a nickel alloy and the second material may include palladium. In some examples, the method 500 may further include forming a layer of the first material along the base of the trench in the solder resist layer. The first material may include the first material 110 of FIGS. 1A-1D, the first material 210 of FIGS. 2A-2D, the first material 310 of FIGS. 3A-3D, the layers 424, 434, 444, and/or 454 of FIG. 4, or combinations thereof. The second material may include the second material 112 of FIGS. 1B-1D, the second material 212 of FIGS. 2A-2D, the second material 312 of FIGS. 3B-3D, the layers 426, 436, 446, and/or 456 of FIG. 4, or combinations thereof. The solder resist layer may include the solder resist layer 104 of FIGS. 1A-1D, the solder resist layer 204 of FIGS. 2A-2D, the solder resist layer 304 of FIGS. 3A-3D the solder resist layer 412 of FIG. 4, or combinations thereof. The trench may include the trench 108 of FIGS. 1A-1B, the trench 208 of FIG. 2A, the trench 308 of FIGS. 3A-3B, the trenches 423, 433, 443, and/or 453 of FIG. 4, or combinations thereof.

In some examples, the method 500 may further include etching the solder resist layer to reduce the height of the solder resist layer prior to reflow and deflux of the solder bump. In some examples, the first material may contact an electrode, such as the electrode 110 of FIGS. 1A-1D, the electrode 210 of FIGS. 2A-2D, the electrode 310 of FIGS. 3A-3D the electrodes 428, 438, 448, and/or 458 of FIG. 4, or combinations thereof. In some embodiments, forming the layer of the first material along the base of the trench in the solder resist layer may include forming a layer of the first material along sidewalls of the trench in the solder resist layer. In some embodiments, forming the layer of the second material may include forming a layer of the second material over the first material along sidewalls of the trench in the solder resist layer The method 500 may further include depositing a third material that includes tin or tin alloy on the second material using an electroless deposition process, at 520. The third material may include the third material 120 of FIG. 1C, the third material 220 of FIGS. 2B-2C, the third material 320 of FIG. 3C, the tin/tin alloy material 432, 442, and/or 452 of FIG. 4, or combinations thereof. In some embodiments, the method 500 may further include, after depositing the third material, etching the solder resist layer to reduce a height of the solder resist layer. In some examples, depositing the third material that includes tin/tin alloy on the second material may include filling the trench with the third material such that the third material extends to a top edge of the trench. In other examples, depositing the third material that includes tin/tin alloy on the second material may include filling the trench with the third material such that the third material extends above a top edge of the trench.

The method 500 may further include forming a solder bump out of the third material using a reflow and deflux process, at 530. The solder bump may include the solder bump 121 of FIG. 1D, the solder bump 221 of FIG. 2D, the solder bump 321 of FIG. 3D, the tin/tin alloy material 422, 432, 442, and/or 452 of FIG. 4, or combinations thereof. The solder bump may provide a connection point to connect to a connection point of another die, such as the die 404 of FIG. 4.

FIG. 7 illustrates a method 700 for forming multiple solder bump in accordance with some embodiments. The method 700 may be implemented the packages 100-103 of FIGS. 1A-1D, respectively, the packages 200-203 of FIGS. 2A-2D, respectively, the packages 300-303 of FIGS. 3A-3D, respectively, respectively, the apparatus 400 of FIG. 4, or combinations thereof.

The method 600 may include forming a first pair of ENEPET stacks in a solder resist layer of a package, at 610. The first pair of ENEPET stacks may each may include the materials 110, 112, and 120/121 of FIGS. 1C-1D, the materials 210, 212, and 220/221 of FIGS. 2B-2D, the materials 310, 312, and 320/321 of FIGS. 3B-3D, the pair of the ENEPET stacks 420 and 430 of FIG. 4, or combinations thereof.

In some examples, forming the first pair of ENEPET stacks in the solder resist layer of the package may include forming a layer of a second material over a first material at a base of a trench in the solder resist layer, and depositing a third material that includes tin/tin alloy on the second material using an electroless deposition process. The first material may include nickel or a nickel alloy and the second material may include palladium. In some examples, the second material may not include nickel. In some examples, the method 600 may further include forming a layer of the second material over the first material along sidewalls of the trench in the solder resist layer. The first material may include the first material 110 of FIGS. 1A-1D, the first material 210 of FIGS. 2A-2D, the first material 310 of FIGS. 3A-3D, the layers 424, 434, 444, and/or 454 of FIG. 4, or combinations thereof. The second material may include the second material 112 of FIGS. 1B-1D, the second material 212 of FIGS. 2A-2D, the second material 312 of FIGS. 3B-3D, the layers 426, 436, 446, and/or 456 of FIG. 4, or combinations thereof. The solder resist layer may include the solder resist layer 104 of FIGS. 1A-1D, the solder resist layer 204 of FIGS. 2A-2D, the solder resist layer 304 of FIGS. 3A-3D, the solder resist layer 412 of FIG. 4, or combinations thereof. The trench may include the trench 108 of FIGS. 1A-1B, the trench 208 of FIG. 2A, the trench 308 of FIGS. 3A-3B, the trenches 423, 433, 443, and/or 453 of FIG. 4, or combinations thereof. The third material may include the third material 120 of FIG. 1C, the third material 220 of FIGS. 2B-2C, the third material 320 of FIG. 3C, the tin/tin alloy material 422, 532, 442, and/or 452 of FIG. 4, or combinations thereof.

The method 600 may further include, contemporaneously with forming the first pair of ENEPET stacks in the solder resist layer of the package, forming a second pair of ENEPET stacks in the solder resist layer of the package, at 620. A width of the first pair of ENEPET stacks may have a greater pitch than the second pair of ENEPET stacks. In some examples, a pitch of the second pair of ENEPET stacks may be 20-25 µm. The second pair of ENEPET stacks may include the materials 110, 112, and 120/121 of FIGS. 1C-1D, the materials 210, 212, and 220/221 of FIGS. 2B-2D, the materials 310, 312, and 320/321 of FIGS. 3B-3D, the pair of the ENEPET stacks 440 and or 450 of FIG. 4, or combinations thereof.

In some examples, the method 600 may further include forming a first electrode that extends through the solder resist layer, a first Ajinomoto build-up film (ABF) layer to a second ABF layer (e.g, the electrode 428 or 438 of FIG. 4), and forming a second electrode that extends through the solder resist layer and the first Ajinomoto build-up film to an interconnect bridge (e.g, the electrode 448 or 458 of FIG. 4). The Ajinomoto build-up film may include the first ABF 514 of FIG. 4 and the interconnect bridge may include the EMIB 418 of FIG. 4.

The first pair of ENEPET stacks and the second pair of ENEPET stacks may be used as connection points to contacts of another die, such as contacts 460, 470, 480, and 490 of the die 404 of FIG. 4.

To better illustrate the methods and device disclosed herein, a non-limiting list of embodiments is provided here:

Example 1 includes subject matter (such as a device, apparatus, or machine) including a package comprising a package comprising solder resist layer; an electrode embedded in a bottom portion of the solder resist layer; and a solder bump extending through the solder resist layer to the electrode, the solder bump including an electroless nickel, electroless palladium, electroless tin (ENEPET) stack.

In Example 2, the subject matter of Example 1 may include, wherein the ENEPET stack comprises: a first layer contacting the electrode, wherein the first layer includes a nickel- material; a second layer over the first layer, wherein the second layer includes palladium; and a third layer over the second layer, wherein the third layer includes tin or a tin alloy.

In Example 3, the subject matter of any one of Examples 1 to 2 may include, wherein the package further comprises: a second electrode embedded in a bottom portion of the solder resist layer in parallel with the electrode; and a second solder bump extending through the solder resist layer to the second electrode, the second solder bump including a second ENEPET stack; wherein a pitch between the second ENEPET stack and an adjacent stack is different than a pitch between the ENEPET stack an adjacent stack.

In Example 4, the subject matter of any one of Examples 1 to 3 may include, wherein the pitch between the ENEPET stack the adjacent stack is less than 25 µm.

Example 5 includes subject matter (such as a device, apparatus, or machine) comprising a first pair of electroless nickel, electroless palladium, electroless tin (ENEPET) stacks formed in a solder resist layer of the package having a first pitch; and a second pair of ENEPET stacks formed in the solder resist layer of the package having a second pitch, wherein the first pitch is greater than the second pitch.

In Example 6, the subject matter of Example 5 may include, wherein the first pitch is greater than 100 µm and the second pitch is less than 25 µm.

In Example 7, the subject matter of any one of Examples 5 to 6 may include, wherein a first ENEPET stack of the first pair of ENEPET stacks in the solder resist layer of the package comprises: a layer of a first material at a base of a trench in the solder resist layer; a layer of a second material over a first material at the base of the trench; and a third material that includes tin deposited on the second material using an electroless deposition process.

In Example 8, the subject matter of any one of Examples 5 to 7 may include, wherein the layer of the first material extends along the sidewalls of the trench in the solder resist layer, and where the layer of the second material extends over the first material along the sidewalls of the trench in the solder resist layer.

In Example 9, the subject matter of any one of Examples 5 to 8 may include, wherein the first material includes nickel and the second material includes palladium.

In Example 10, the subject matter of any one of Examples 5 to 9 may include, an first electrode that extends through a portion of the solder resist layer and through a first Ajinomoto build-up film (ABF) layer to a second ABF layer, wherein a first ENEPET stack of the pair of ENEPET stacks contacts the first electrode; and a second electrode that extends through a portion of the solder resist layer and through the first ABF layer to an interconnect bridge, wherein a second ENEPET stack of the pair of ENEPET stacks contacts the second electrode.

Example 11 includes subject matter (such as a method, means for performing acts, machine readable medium including instructions that when performed by a machine cause the machine to performs acts, or an apparatus to perform) to form a solder bump comprising forming a layer of a second material over a first material at a base of a trench in a solder resist layer, wherein the first material includes nickel and the second material includes palladium; depositing a third material that includes tin on the second material using an electroless deposition process; and forming a solder bump out of the third material using a reflow and deflux process.

In Example 12, the subject matter of Example 11 may include, forming a layer of the first material along the base of the trench in the solder resist layer.

In Example 13, the subject matter of any one of Examples 11 to 12 may include, wherein the first material contacts an electrode.

In Example 14, the subject matter of any one of Examples 11 to 13 may include, forming the electrode; and forming the solder resist layer over the electrode.

In Example 15, the subject matter of any one of Examples 11 to 14 may include, wherein forming the layer of the first material along the base of the trench in the solder resist layer includes forming a layer of the first material along sidewalls of the trench in the solder resist layer.

In Example 16, the subject matter of any one of Examples 11 to 15 may include, wherein forming the layer of the second material further comprises forming a layer of the second material over the first material along sidewalls of the trench in the solder resist layer.

In Example 17, the subject matter of any one of Examples 11 to 16 may include, prior to forming the trench in the solder resist layer, etching the solder resist layer to reduce a height of the solder resist layer.

In Example 18, the subject matter of any one of Examples 11 to 17 may include, after depositing the third material, etching the solder resist layer to reduce a height of the solder resist layer.

In Example 19, the subject matter of any one of Examples 11 to 18 may include, forming the trench in the solder resist layer.

In Example 20, the subject matter of any one of Examples 11 to 19 may include, wherein the solder bump has a circular or elliptical shape.

In Example 21, the subject matter of any one of Examples 11 to 20 may include, wherein depositing the third material that includes tin on the second material comprises filling the trench with the third material such that the third material extends to a top edge of the trench.

In Example 22, the subject matter of any one of Examples 11 to 21 may include, wherein depositing the third material that includes tin on the second material comprises filling the trench with the third material such that the third material extends above a top edge of the trench.

Example 23 includes an apparatus comprising means for performing any of the Examples 10-22.

Example 24 includes subject matter (such as a method, means for performing acts, machine readable medium including instructions that when performed by a machine cause the machine to performs acts, or an apparatus to perform) to form a solder bump comprising forming a first pair of electroless nickel, electroless palladium, electroless tin (ENEPET) stacks in a solder resist layer of a package; and contemporaneously with forming the first pair of ENEPET stacks in the solder resist layer of the package, forming a second pair of ENEPET stacks in the solder resist layer of the package, wherein a pitch between the first pair of ENEPET stacks is greater than a pitch between the second pair of ENEPET stacks.

In Example 25, the subject matter of Example 24 may include, wherein a pitch of the second pair of ENEPET stack is less than 25 µm.

In Example 26, the subject matter of any one of Examples 24 to 25 may include, wherein forming the first pair of ENEPET stacks in the solder resist layer of the package comprises: forming a layer of a second material over a first material at a base of a trench in the solder resist layer, wherein the first material includes palladium and nickel and the second material includes palladium; and depositing a third material that includes tin on the second material using an electroless deposition process.

In Example 27, the subject matter of any one of Examples 24 to 26 may include, forming a layer of the second material over the first material along sidewalls of the trench in the solder resist layer.

In Example 28, the subject matter of any one of Examples 24 to 27 may include, forming a first electrode that extends through a portion of the solder resist layer and through a first Ajinomoto build-up film (ABF) layer to a second ABF layer; and forming a second electrode that extends through a portion of the solder resist layer and through the first ABF to an interconnect bridge.

Example 29 includes an apparatus comprising means for performing any of the Examples 24-28.

These examples are intended to provide non-limiting examples of the present subject matter—they are not intended to provide an exclusive or exhaustive explanation. The detailed description above is included to provide further information about the present devices, and methods.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

The invention claimed is:

1. An apparatus including a package comprising:
 a first pair of nickel, palladium, tin (NPT) stacks formed in a solder resist of the package, the first pair of NPT stacks having a first pitch;
 a second pair of NPT stacks formed in the solder resist of the package having a second pitch, wherein the first pitch is different than the second pitch;
 a first electrode that extends through a portion of the solder resist and through a first dielectric layer to a second dielectric layer, wherein a first NPT stack of the first pair of NPT stacks contacts the first electrode;
 a second electrode that extends through a portion of the solder resist and through the first dielectric layer to an embedded multi-die interconnect bridge (EMIB) configured to provide high-bandwidth connection between a first die and a second die, wherein a second NPT stack of the second pair of NPT stacks contacts the second electrode; and
 a die-bond film (DBF) adhering the EMIB to an electrode in the second dielectric layer.

2. The apparatus of claim 1, wherein the second pitch is greater than 100 µm.

3. The apparatus of claim 2, wherein the first pitch is less than 25 µm.

4. The apparatus of claim 1, wherein the first NPT stack is situated in a first trench in the solder resist that includes sidewalls angled outward from a horizontal center of the trench.

5. The apparatus of claim 1, wherein the first NPT stack is situated in a first trench in the solder resist that includes sidewalls perpendicular to a top surface of the solder resist.

6. The apparatus of claim 1, wherein he nickel of the first NPT stack includes a nickel alloy.

7. The apparatus of claim 1, wherein the tin of the first NPT stack includes a tin alloy.

8. The apparatus of claim 1, wherein the first NPT stack is situated in a first trench in the solder resist and the tin extends above a top surface of the solder resist.

9. The apparatus of claim 1, wherein the first NPT stack is situated in a first trench in the solder resist and the nickel of the first NPT stack conforms to and contacts sidewalls of the first trench.

10. The apparatus of claim 9, wherein the palladium of the first NPT stack is in contact with and conforms to the nickel along the sidewalls of the first trench.

11. The apparatus of claim 1, wherein each of the first pair and second pair of NPT stacks in the solder resist layer of the package comprises:
    the nickel at a base of a trench in the solder resist;
    the palladium on the nickel; and
    the tin on the palladium.

12. The apparatus of claim 7, wherein the nickel of each NPT stack is disposed at the base and from the base to a top surface of the solder resist layer along a sidewall of a trench in the solder resist layer, and the palladium of each NPT stack is disposed on and conforms to the nickel to the top surface of the solder resist layer.

13. An apparatus including a package comprising:
    the package comprising:
    a solder resist;
    a first electrode embedded in a bottom portion of the solder resist;
    a solder bump extending through the solder resist to the first electrode, the solder bump including a nickel, palladium, and tin (NPT)stack;
    a second electrode embedded in the bottom portion of the solder resist in parallel with the first electrode;
    a second solder bump extending through the solder resist to the second electrode, the second solder bump including a second NPT stack;
    a third electrode embedded in the bottom portion of the solder resist in parallel with the first electrode and the second electrode;
    a third solder bump extending through the solder resist to the third electrode, the third solder bump including a third NPT stack;
    an embedded multi-die interconnect bridge (EMIB) configured to provide high-bandwidth connection between a first die and a second die electrically coupled to the first NPT stack;
    a die-bond film (DBF) adhering the EMIB to an electrode in the second dielectric layer;
    wherein a pitch between the first solder bump and the second solder bump is different than a pitch between the second solder bump and the third solder bump;
    wherein the first electrode extends through a portion of the solder resist and through a first dielectric layer to a second dielectric layer;
    wherein the first NPT stack contacts the first electrode; and
    wherein the second electrode extends through a portion of the solder resist and through the first dielectric layer and contacts the second solder bump.

14. The apparatus of claim 13, wherein the NPT stack comprises:
    a first layer contacting the first electrode, wherein the first layer includes the nickel, a nickel alloy, a cobalt alloy, or an iron alloy;
    a second layer on the first layer, wherein the second layer includes the palladium; and
    a third layer on the second layer, wherein the third layer includes the tin or a tin alloy.

15. The apparatus of claim 13, wherein the first NPT stack is situated in a first trench in the solder resist that includes sidewalls angled outward from a horizontal center of the trench or perpendicular to a top surface of the solder resist.

16. The apparatus of claim 13, wherein the first NPT stack is situated in a first trench in the solder resist and the tin extends above a top surface of the solder resist.

17. The apparatus of claim 13, wherein the first NPT stack is situated in a first trench in the solder resist and the nickel of the first NPT stack conforms to and contacts sidewalk of the first trench.

18. The apparatus of claim 17, wherein the palladium of the first NPT stack is in contact with and conforms to the nickel along the sidewalls of the first trench.

\* \* \* \* \*

UNITED STATES PATENT AND TRADEMARK OFFICE
CERTIFICATE OF CORRECTION

PATENT NO. : 10,438,914 B2
APPLICATION NO. : 16/039595
DATED : October 8, 2019
INVENTOR(S) : Unruh et al.

It is certified that error appears in the above-identified patent and that said Letters Patent is hereby corrected as shown below:

In the Claims

Column 13, Line 12, Claim 6, delete "he" and insert --the-- therefor

Column 14, Line 44, Claim 17, delete "sidewalk" and insert --sidewalls-- therefor Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*